(12) United States Patent
Iwase

(10) Patent No.: US 8,790,479 B2
(45) Date of Patent: Jul. 29, 2014

(54) MANUFACTURING METHOD OF FUNCTIONAL FILM

(71) Applicant: FUJIFILM Corporation, Tokyo (JP)

(72) Inventor: Eijiro Iwase, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/012,504

(22) Filed: Aug. 28, 2013

(65) Prior Publication Data

US 2013/0340931 A1 Dec. 26, 2013

Related U.S. Application Data

(63) Continuation of application No. PCT/JP2012/053941, filed on Feb. 20, 2012.

(30) Foreign Application Priority Data

Mar. 2, 2011 (JP) ................................. 2011-045193

(51) Int. Cl.
*B05D 7/00* (2006.01)
*C23C 28/00* (2006.01)
*C23C 16/34* (2006.01)
*C23C 16/02* (2006.01)
*C23C 16/56* (2006.01)
*C23C 16/54* (2006.01)
*C08J 7/04* (2006.01)

(52) U.S. Cl.
CPC . *B05D 7/56* (2013.01); *C23C 28/00* (2013.01); *C23C 16/345* (2013.01); *C23C 16/0272* (2013.01); *B05D 2350/60* (2013.01); *C23C 16/56* (2013.01); *C23C 16/545* (2013.01); *C08J 7/045* (2013.01)

USPC ..... 156/247; 427/402; 427/407.1; 427/419.5; 427/569

(58) Field of Classification Search
CPC .......................................................... B05D 7/56
USPC ............. 156/247; 427/402, 407.1, 419.5, 569
See application file for complete search history.

(56) References Cited

U.S. PATENT DOCUMENTS

2006/0232735 A1* 10/2006 Hokazono et al. ............ 349/122
2009/0095345 A1* 4/2009 Murakami et al. ............ 136/252

FOREIGN PATENT DOCUMENTS

JP 2009-269193 A 11/2009

OTHER PUBLICATIONS

International Search Report issued in PCT/JP2012/053941, dated May 22, 2012.

* cited by examiner

*Primary Examiner* — Michael Orlando
*Assistant Examiner* — Daniel Lee
(74) *Attorney, Agent, or Firm* — Jean C. Edwards; Edwards Neils PLLC

(57) ABSTRACT

An object is to provide a manufacturing method of a functional film where it is possible to stably manufacture a functional film which favorably exhibits the intended function and has excellent optical characteristics. The problem is solved by forming an uppermost organic layer of an organic layer with a thickness of 30 to 300 nm by using a coating material containing a surfactant where the content is 0.01 to 10 mass % when the uppermost organic layer is formed.

13 Claims, 3 Drawing Sheets

MANUFACTURING METHOD OF FUNCTIONAL FILM

CROSS-REFERENCE TO RELATED APPLICATIONS

This application is a Continuation of International Application No. PCT/JP2212/053941 filed on Feb. 20, 2012, which was published under PCT Article 21(2) in Japanese, which is based upon and claims the benefit of priority from Japanese Patent Application No. 2011-045193 filed on Mar. 2, 2011, the contents of both of which are incorporated herein by reference in their entirety.

BACKGROUND OF THE INVENTION

1. Field of the Invention

The present invention relates to a manufacturing method of a functional film such as a gas barrier film by alternately forming organic layers and inorganic layers on a substrate.

2. Description of the Related Art

Gas barrier films are used in package materials which package parts and products where moisture resistance is necessary in display apparatuses such as optical elements, liquid crystal displays, and organic EL displays, various types of semiconductor apparatuses, and various types of apparatus such as solar batteries; food products; electronic products; and the like.

Gas barrier films generally have a configuration where a plastic film such as a polyethylene terephthalate (PET) film is set as the substrate (support body) and a film (also referred to below as a gas barrier film) which exhibits the gas barrier property is film-formed on the substrate. In addition, as the gas barrier films which are used in the gas barrier film, for example, films, which are formed of, for example, various types of inorganic compounds such as silicon nitride, silicon oxide, and aluminum oxide, are known.

Among such gas barrier films, laminated type gas barrier films where a plurality of films are laminated, such as gas barrier films which have a laminated structure of films formed of organic compounds (organic layers, organic compound layers) and films formed of inorganic compounds (inorganic layers, inorganic compound layers), are also known as gas barrier films which are able to obtain a higher gas barrier property.

For example, JP2009-269193A describes a manufacturing method of a laminated body where a coating film is provided by coating a coating liquid which contains a monomer or an oligomer on a substrate; a base layer which includes two or more organic layers is formed by repeating a step of film-forming organic layers by curing the coating film; and an inorganic layer is formed on the base layer by a vacuum deposition method.

In the gas barrier film which is described in JP2009-269193A, by forming the inorganic layer which has the gas barrier property after forming the organic layers as the base layer, it is possible to form a uniform inorganic layer without defects such as cracking and peeling by using the smoothness of the surface of the organic layer. Therefore, according to such a laminated type gas barrier film, it is possible to obtain a gas barrier film which has a high gas barrier property where the gas barrier property of the inorganic layer is sufficiently exhibited.

In gas barrier films (gas barrier films) which have a laminated structure of organic layers and inorganic layers as above, obtaining a higher gas barrier property by stacking two or more laminated bodies of organic layers and inorganic layers is also known.

In addition, inorganic films such as silicon nitride films and silicon oxide films which are used as gas barrier films are generally brittle and thin films. Therefore, in a case where laminated bodies of organic layers and inorganic layers are used as a gas barrier film, imparting a function as a protective film by forming an organic layer at the uppermost layer (the uppermost layer of the opposite side to the substrate of the laminated body) is also known. In this manner, by forming the organic layer as the protective film at the uppermost layer, it is possible to stably perform treatments using Roll to Roll to be described later or processing such as cutting with respect to the gas barrier film which has an inorganic film which is easily broken.

SUMMARY OF THE INVENTION

In general, in gas barrier films which have a laminated structure of organic layers and inorganic layers, the organic layers are formed by a coating method which uses a coating material which contains a polymerizable organic compound and the inorganic layers are formed by a vapor-phase deposition method (a vacuum deposition method) such as plasma CVD.

Here, in particular, in gas barrier films which are used for optical applications such as various types of optical elements, display apparatuses such as liquid crystal displays or organic EL displays, and the like, excellent optical characteristics (in particular, a light transmission property) are also one of the important functions as well as a high gas barrier property.

Accordingly, the gas barrier film preferably has a layer configuration where it is possible to suppress the reflection of light. Here, in the gas barrier films which have an organic layer which functions as a protective layer at the uppermost layer, since the interface with the air is an organic layer, the characteristics of the organic layer greatly influence the optical characteristics.

That is, when the uppermost layer of the organic layers is thick, the transmission rate is decreased as a result. Therefore, it is desirable that the uppermost layer of the organic layers have a sufficient function as a protective film and be thin.

However, as is well known, the inorganic layer and the organic layer (film of an inorganic compound and film of an organic compound) have completely different characteristics. In addition, the forming methods (film-forming methods) of these two are a coating method and a vapor-phase deposition method, which are completely different.

Therefore, in consideration of the fact that the base layer (that is, a film-forming surface) is an inorganic layer, when appropriate organic layer forming conditions are not set, there are many cases where it is not possible to stably form a thin and uniform organic layer.

An object of the present invention is to provide a manufacturing method of a functional film where it is possible to form an uppermost layer of the organic layers which is thin, has no parts missing or the like, and has excellent optical characteristics and protection performance using a coating method in the manufacturing of a functional film such as a gas barrier film where organic layers and inorganic layers are laminated on a substrate (a support body) and the uppermost layer is an organic layer, whereby it is possible to stably manufacture a functional film which not only has predetermined functions such as a gas barrier property, but also excellent optical characteristics.

A manufacturing method of a functional film of the present invention which solves the above-described problems includes forming one or more organic layers and one or more inorganic layers alternately on a substrate; and forming an organic layer on a surface of one of the inorganic layer as an uppermost layer, wherein the organic layer as the uppermost layer has a thickness of 30 to 300 nm and is formed by using a coating material containing an organic solvent, an organic compound, and a surfactant, and the content of the surfactant in the organic layer as the uppermost layer is 0.01 to 10 mass %.

In the manufacturing method of the functional film of the present invention, it is preferable that the organic compound be a (meth)acrylate-based organic compound capable of cross-linking by a photopolymerization reaction.

In addition, it is preferable that the inorganic layer upon whose surface the uppermost layer is formed be formed with any one of silicon nitride, silicon oxide, silicon oxynitride, and aluminum oxide.

In addition, it is preferable that the inorganic layer upon whose surface the uppermost layer is formed be formed with a silicon compound, and the surfactant not include a silicon compound, or include 5 mass % or less of a silicon compound.

In addition, it is preferable that the viscosity of the coating material is 10 cP or more in a state where the organic solvent remaining in the coating material is 10 mass % or less.

In addition, it is preferable that the viscosity of the coating material prior to coating of the coating material be 10 cP or less.

In addition, it is preferable that the coating material is applied with a die coater.

In addition, it is preferable that, the manufacturing method of a functional film includes; forming the inorganic layer upon whose surface the uppermost layer is able to be formed; attaching the protective film to the surface of the inorganic layer; and peeling off the protective film to form the uppermost layer.

In addition, it is preferable that the forming of the inorganic layer upon whose surface the uppermost layer is able to be formed and the attaching of the protective film to the surface of the inorganic layer be carried out under reduced pressure.

In addition, it is preferable that the surface energy of the inorganic layer upon whose surface the uppermost layer is formed is 30 mN/N or more.

In addition, it is preferable that the inorganic layer upon whose surface the uppermost layer is be able to be formed is formed by plasma CVD or vacuum deposition.

According to the manufacturing method of a functional film of the present invention which has the above-described configuration, in the manufacturing of a functional film where an organic layer and an inorganic layer are alternately laminated on a substrate and the uppermost layer is an organic layer, it is possible to stably form (film-form) an organic layer, which, even when thin, appropriately functions as a protective film of an inorganic layer without any missing parts or the like, as the uppermost layer using a coating method.

Therefore, according to the present invention, it is possible to stably manufacture a functional film which appropriately exhibits a function of setting a suitably protected inorganic layer as intended and which has excellent optical characteristics.

DESCRIPTION OF THE PREFERRED EMBODIMENTS

Below, detailed description will be given of the manufacturing method of the functional film of the present invention based on preferable Examples which are shown in the accompanying diagrams.

Figure 1A:
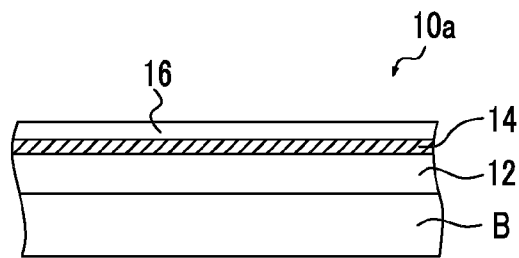
FIGS. 1A, 1B, and 1C are views which conceptually show an example of a functional film which is manufactured by the manufacturing method of the present invention.
Figure 1B:
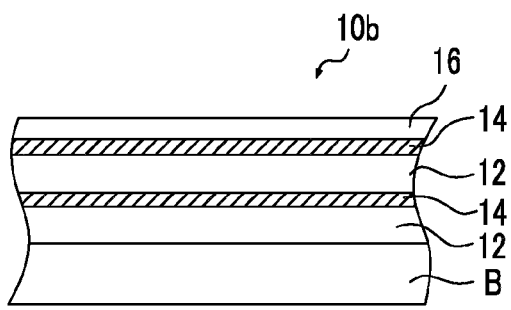
Figure 1C:
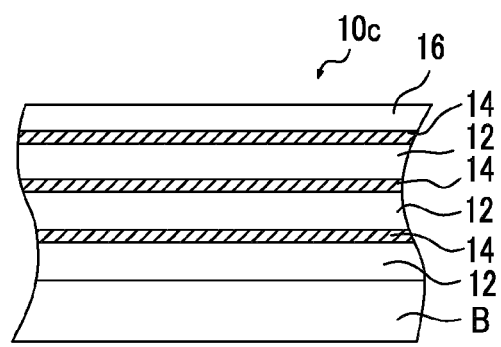

FIGS. 1A, 1B, and 1C conceptually show an example of a functional film which is manufactured with the manufacturing method of the functional film of the present invention.

The manufacturing method of the functional film of the present invention manufactures a functional film where an organic layer and an inorganic layer are alternately laminated on a substrate, which has two or more organic layers, and furthermore where the uppermost layer (the outermost layer of the opposite side to the substrate/the farthest layer from the substrate in the functional film) is an organic layer.

A functional film 10a which is shown in FIG. 1A has an organic layer 12 on (the surface) of a substrate B, has an inorganic layer 14 on the organic layer 12, and has a protective organic layer 16 which is the uppermost layer of the organic layers on the inorganic layer 14.

Here, the functional film which is manufactured with the manufacturing method of the present invention is not limited to a film which has a total of three alternate layers of organic layers and an inorganic layer on the substrate B where the inorganic layer is interposed between the two organic layers as shown in the example in the diagram.

That is, it is also possible to suitably use the manufacturing method of the present invention in the manufacturing of a functional film which has two or more combinations of organic layers and inorganic layers as long as an organic layer is formed on the surface of the substrate B and, in addition, the uppermost layer is an organic layer. In this manner, by having a plurality of sets of combinations of organic layers and inorganic layers, it is possible to manufacture a functional film which exhibits higher functionality such as a superior gas barrier property.

For example, it is also possible to use the manufacturing method of the present invention in the manufacturing of a functional film 10b having the organic layer 12 on the surface of the substrate B, the inorganic layer 14 thereon, the organic layer 12 thereon, the inorganic layer 14 thereon, and the protective organic layer 16 which is the uppermost layer of the organic layers as shown in FIG. 1B, so as to have a total of five alternate layers of organic layers and inorganic layers on the substrate B.

Alternatively, it is also possible to use the manufacturing method of the present invention in the manufacturing of a functional film 10c having a first organic layer 12 on the surface of the substrate B, the inorganic layer 14 thereon, an intermediate organic layer 12 thereon, the inorganic layer 14 thereon, and an intermediate organic layer 12 thereon, the inorganic layer 14 thereon, and the protective organic layer 16 which is the uppermost layer of the organic layers as shown in FIG. 1C, so as to have a total of seven alternate layers of organic layers and inorganic layers on the substrate B.

Furthermore, it is also possible to use the manufacturing method of the present invention in the manufacturing of a functional film which has a total of nine or more alternate layers of the organic layers and the inorganic layers.

In the manufacturing method of the present invention, the substrate (base material/support body) B is not particularly limited, and it is possible to use various types of well-known sheet-shaped materials which are used as the substrates of functional films such as gas barrier films.

It is preferable that a long, sheet-shaped substrate B (web shaped substrate B) be used in order for it to be possible to form the organic layers and the inorganic layers with the Roll to Roll which will be described later.

Suitable examples of the substrate B include plastic films formed of various types of plastics (polymer materials), specifically, polyethylene terephthalate (PET), polyethylene naphthalate (PEN), polyethylene, polypropylene, polystyrene, polyamide, polyvinyl chloride, polycarbonate, polyacrylonitrile, polyimide, polyacrylate, and polymethacrylate, and the like.

In addition, the substrate B may be a substrate where a layer (film) is formed in order to obtain various types of functions such as a protective layer, an adhesive layer, a light-reflecting layer, an anti-reflection layer, a light-shielding layer, a planarization layer, a buffer layer, a stress relaxation layer, or the like.

The organic layers 12 are films (films where an organic compound is the main component) formed of organic compounds and are cured (into a cured film) by cross-linking (polymerizing) monomers or oligomers of organic compounds.

In the manufacturing method of the present invention (the functional film according to the manufacturing method of the present invention), the organic layer 12 basically functions as a base layer which planarizes the forming surface (film-forming surface) of the inorganic layer 14 which exhibits the intended function such as the gas barrier property. By having the organic layer 12, it is possible to form a uniform inorganic layer 14 without splitting, cracking, peeling, or the like, and it is possible to manufacture a functional film which appropriately exhibits the intended functions.

In the manufacturing method of the present invention, the forming material of the organic layer 12 is not particularly limited and it is possible to use various types of well-known organic compounds (resins/polymer materials).

Specifically, suitable examples thereof include thermoplastic resins such as polyester, acrylic resins, methacrylic resin, methacrylic acid-maleic acid copolymers, polystyrene, transparent fluorine resin, polyimide, fluorinated polyimide, polyamide, polyamide-imide, polyetherimide, cellulose acylate, polyurethane, polyether ether ketone, polycarbonate, alicyclic polyolefin, polyarylate, polyether sulfone, polysulfone, fluorene ring-modified polycarbonate, alicyclic-modified polycarbonate, fluorene ring-modified polyester, and acryloyl compounds, or polysiloxane, and other organosilicon compounds.

Among these above, the organic layer 12 where it is possible to planarize the forming surface of the inorganic layer 14 and sufficiently exhibit the functions of the inorganic layer 14 and, furthermore, which is configured from a polymer material of a cationically polymerizable compound which has a radically polymerizable compound and/or an ether group as a functional group is suitable from the point of view of having excellent heat resistance.

Among the above, in terms of also being excellent in strength and optical characteristics in addition to the above-described planarization and heat resistance, suitable examples of the organic layer 12 include acrylic resins, methacrylic resins, or the like where polymers of monomers or oligomers of acrylate and/or methacrylate are set as the main component.

Here, the organic layers 12 may all be formed of the same material, may each include different materials, or may all be formed of different materials. In addition, the organic layers 12 may be formed of the same material as the protective organic layer 16 to be described later.

As described above, in the manufacturing method of the present invention, the organic layer 12 basically functions as a base layer which planarizes the forming surface of the inorganic layer 14.

Accordingly, the thickness of the organic layer 12 may be set to an appropriate thickness where it is possible to achieve the object. In particular, according to research by the present inventors, the thickness of the organic layer 12 is preferably set to 500 to 3000 nm. By setting the thickness of the organic layer 12 to 500 nm or more, it is possible to obtain sufficient surface planarization as the base layer of the inorganic layer 14. In addition, setting the thickness to 3000 nm or less is preferable since there are concerns that cracking will occur and the transmission rate will be decreased when the organic layer 12 is excessively thick. In addition, for the same reason, the thickness of the organic layer 12 is more preferably set to 500 to 2500 nm.

The inorganic layer 14 is a film formed of an inorganic compound (a film where an inorganic compound is set as the main component). In the functional film which is manufactured in the present invention, the inorganic layer 14 mainly exhibits the intended functions such as the gas barrier property, optical filter characteristics such as the transmission or shielding of predetermined wavelength bands, and the like.

Among the above, in the manufacturing method of according to the present invention, since there is an organic layer as the base layer for planarization, suitable examples in terms of having a large effect due to planarization include an inorganic layer 14 which has a gas barrier property. That is, the manufacturing method of the present invention is particularly preferably used in the manufacturing of gas barrier films.

As the inorganic layer 14, it is possible to use various types of films formed of inorganic compounds which are able to exhibit the intended functions of the functional film such as the above-described gas barrier property and the optical filter characteristics.

For example, as the functional film, in a case where the gas barrier film is manufactured, a film formed of various types of inorganic compound which exhibits the gas barrier property may be formed.

Specifically, suitable examples thereof include films formed of inorganic compounds such as metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxynitride, silicon carbide acid, and oxynitride silicon carbide; silicon nitrides such as silicon nitride and silicon nitride carbide; silicon carbides such as silicon carbide; hydrides thereof; mixtures of two or more types thereof, and hydrogen-containing materials thereof, and the like.

In particular, silicon nitride, silicon oxide, silicon oxynitride, and aluminum oxide are suitably used in the gas barrier film in terms of being able to exhibit an excellent gas barrier property.

Here, the inorganic layers 14 may all be formed of the same material, may each include different materials, or may all be formed of different materials.

In the present invention, the thickness of the inorganic layer 14 is not particularly limited. That is, the film thickness of the inorganic layer 14 may be appropriately determined as a thickness where it is possible to exhibit the intended functions depending on the forming material; however, 15 to 200 nm is preferable.

By setting the thickness of the inorganic layer 14 to 15 nm or more, it is possible to form an inorganic layer 14 where it is possible to stably exhibit a sufficient function. In addition, in general, when the inorganic layer 14 is brittle and too thick, there is a possibility that cracking, splitting, peeling, or the like will occur; however, by setting the thickness of the inorganic layer 14 to 200 nm or less, it is possible to prevent the generation of cracking.

In addition, in consideration of the above points, the thickness of the inorganic layer 14 is preferably set to 15 to 100 nm, particularly preferably set to 20 to 75 nm.

In the manufacturing method of the functional film of the present invention, the protective organic layer 16 is formed in order to protect the inorganic layer 14 which is mainly formed to be uppermost on the uppermost layer (the outermost layer of the opposite side to the substrate/the farthest layer from the substrate in the functional film).

As described above, in general, the inorganic layer 14 is brittle, and is a thin film. Therefore, in the functional film 10a or the like where the organic layers 12 and the inorganic layers 14 are alternately laminated, by forming the protective organic layer 16 which has the function as the protective layer on the uppermost layer, it is possible to stably perform treatments using Roll to Roll to be described later or processing such as cutting with respect to the inorganic layer 14 which is easily broken.

In the manufacturing method of the present invention, as the protective organic layer 16, it is possible to use various types of film formed of the same organic compounds as the above-described organic layer 12.

In particular, even when the film thickness of the protective organic layer 16 is thin, in terms of being able to exhibit a sufficient function as a protective film, the protective organic layer 16 which is configured from a polymer material of a cationically polymerizable compound which has a radically polymerizable compound and/or an ether group as a functional group is suitable.

Among the above, in particular, in addition to the above-described strength, in terms of a low refractive index, excellent optical characteristics, and the like, suitable examples of the material of the protective organic layer 16 include acrylic resins or methacrylic resins where polymers of monomers or oligomers of acrylate and/or methacrylate are set as the main component.

Among the above, in particular, in terms of the viscosity or the like before the cross-linking (the curing) to be described later, suitable examples include polymers of monomers or oligomers of acrylate and/or methacrylate such as dipropylene glycol di(meth)acrylate (DPGDA), trimethylolpropane tri(meth)acrylate (TMPTA), (modified) bisphenol A di(meth)acrylate, dipentaerythritol hexa (meth)acrylate (DPHA), or the like, and among these, polymers of monomers or oligomers of acrylate and/or methacrylate where the viscosity in the monomer or oligomer state is 10 cP or more are particularly suitable.

Here, in the manufacturing method of the present invention, the protective organic layer 16 contains 0.01 to 10 mass % of surfactant. That is, in the manufacturing method of the present invention, the protective organic layer 16 is formed using a coating material which contains a surfactant in an amount where the content is 0.01 to 10 mass % when the protective organic layer 16 is formed.

Detailed description in relation to this point will be given below.

In addition, in the manufacturing method of the present invention, the protective organic layer 16 is formed with a thickness of 30 to 300 nm.

The thicker the protective organic layer 16 is, the more the function as the protective film is exhibited. However, mainly, the optical characteristics of the functional film are greatly influenced by the protective organic layer 16 which is the uppermost layer (outermost surface) which is the interface with the air. Therefore, the protective organic layer 16 is preferably as thin as possible in consideration of the optical characteristics of the functional film to be manufactured, in particular, the light transmission rate.

When the thickness of the protective organic layer 16 is less than 30 nm, the strength of the protective organic layer 16 is insufficient and it is not possible for the protective organic layer 16 to exhibit a sufficient protective performance. In addition, when the thickness of the protective organic layer 16 is less than 30 nm, portions are generated where the protective organic layer 16 is not formed on the surface of the inorganic layer 14 due to the coating material to be described later being repelled. Therefore, splitting or cracking are generated in the inorganic layer 14 which is the lower layer and, for example, with a gas barrier film, it is no longer possible to obtain the predetermined gas barrier performance.

In contrast, when the thickness of the protective organic layer 16 is more than 300 nm, the light transmission rate is lowered, and it is no longer possible to obtain a functional film which has sufficient optical characteristics. Therefore, for example, with the gas barrier film, use as a gas barrier film which is used in optical applications such as liquid crystal displays, organic EL displays, or the like is no longer possible.

In consideration of the above, the thickness of the protective organic layer 16 is 50 to 200 nm, particularly preferably 80 to 120 nm.

Figure 2A:
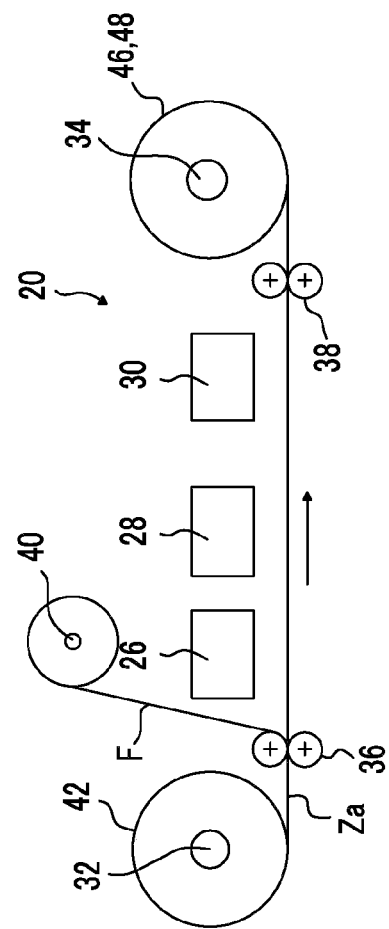
FIGS. 2A and 2B are views which conceptually show an example of manufacturing apparatuses which execute the manufacturing method of the functional film of the present invention, where 2A is a forming apparatus of an organic layer and 2B is a forming apparatus of an inorganic layer.
Figure 2B:
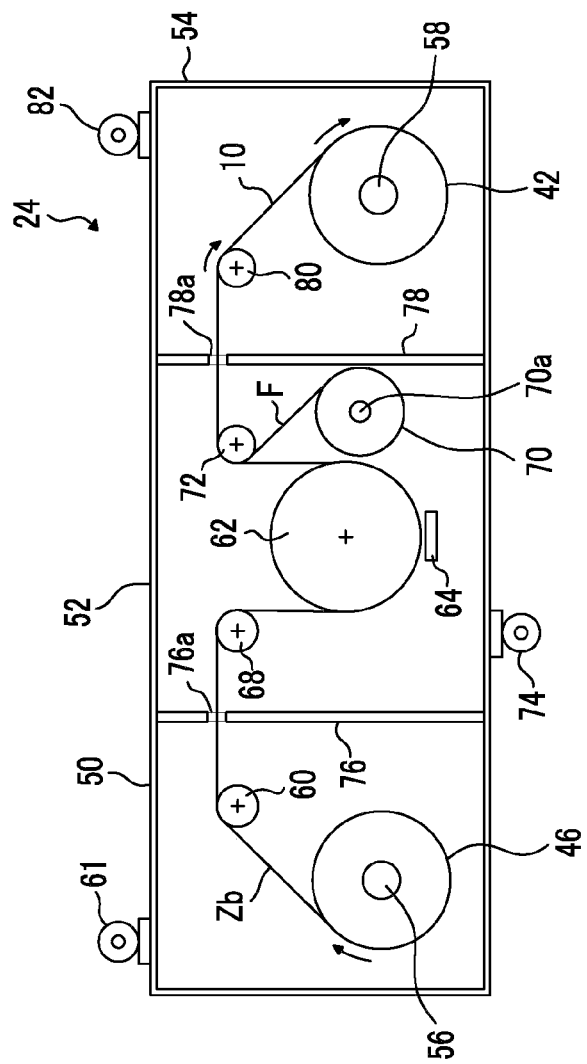

FIGS. 2A and 2B conceptually show an example of a manufacturing apparatus which executes the manufacturing method of the functional film of the present invention.

The manufacturing apparatus has an organic film-forming apparatus 20 which (film-forms) forms the organic layer 12 or the protective organic layer 16 and an inorganic film-forming apparatus 24 which forms an inorganic layer. Here, in FIGS. 2A and 2B, 2A is the organic film-forming apparatus 20 and 2B is the inorganic film-forming apparatus 24.

The organic film-forming apparatus 20 and the inorganic film-forming apparatus 24 shown in FIGS. 2A and 2B are apparatuses which perform the film-forming by feeding out target film-forming material from a material roll where long target film-forming material (web-like target film-forming material) is wound in a roll shape, performing film-forming while transporting the target film-forming material in the longitudinal direction, and re-winding the target film-forming material into a roll shape after the film-forming, that is, by Roll to Roll (also referred to below as R to R).

In the manufacturing method of the present invention, by using the R to R, it is possible to manufacture functional films which high efficiency.

Here, the manufacturing method of the present invention is not limited to manufacture functional films such as gas barrier films with R to R using a long substrate B, and may manufacture functional films using a cut sheet substrate B, that is, using a single wafer type (batch type) film-forming method.

Even in a case where the cut sheet substrate B is used, the forming method of the organic layer 12, the inorganic layer 14, and the protective organic layer 16 which is the organic layer of the uppermost layer is the same as the manufacturing method using R to R which will be described below.

In addition, in the manufacturing method of the present invention, in a case where a plurality of organic layers 12 and/or inorganic layers 14 are formed, the forming method (the film-forming method) may be the same or different for each of the layers.

Here, the apparatuses shown in FIGS. 2A and 2B manufacture a functional film where the organic layers 12 and the inorganic layers 14 are alternately formed on the substrate B as shown in FIGS. 1A to 1C, the organic layer 12 is formed on the surface of the substrate B and, in addition, the uppermost layer of the organic layers is the protective organic layer 16.

Accordingly, in the organic film-forming apparatus 20 of FIG. 2A which forms the organic layer 12 or the protective organic layer 16, the material which becomes a target film-forming material Za is the long substrate B, or a material where the organic layers 12 and the inorganic layers 14 are formed on the long substrate B and whose surface is the inorganic layer 14.

On the other hand, in the inorganic film-forming apparatus 24 of FIG. 2B which forms the inorganic layer 14, the material which becomes a target film-forming material Zb is the material where the organic layer 12 is formed on the long substrate B or the material where the organic layers 12 and the inorganic layer 14 are formed on the long substrate B and whose surface is the organic layer 12.

The organic film-forming apparatus 20 shown in FIG. 2A is an apparatus which cross-links and cures an organic compound which is included in the coating film using light irradiation and forms the organic layer 12 or the protective organic layer 16 after coating and drying the coating material which becomes the organic layer 12 or the protective organic layer 16 while transporting the target film-forming material Za in the longitudinal direction.

The organic film-forming apparatus 20 has coating means 26, drying means 28, light irradiation means 30, a rotary shaft 32, a winding shaft 34, and transport roller pairs 36 and 38 as an example. In addition, the organic film-forming apparatus 20 also has a winding shaft 40 which peels and winds a protective film F which is attached by the inorganic film-forming apparatus 24 which film-forms the inorganic layer 14.

Here, other than the illustrated members, the organic film-forming apparatus 20 may have various types of members which are provided in well-known apparatuses which perform film-forming by coating while transporting a long target film-forming material, such as transport roller pairs, guide members of the target film-forming material Zb, and various types of sensors.

In the organic film-forming apparatus 20, a material roll 42 which is wound with the target film-forming material Za is mounted on the rotary shaft 32.

When the material roll 42 is mounted on the rotary shaft 32, the target film-forming material Za is pulled out from the material roll 42 and passes (sheet passing) along a predetermined transport path which goes through the transport roller pair 36, passes below the coating means 26, the drying means 28, and the light irradiation means 30, goes through the transport roller pair 38, and reaches the winding shaft 34.

In the organic film-forming apparatus 20, the feeding out of the substrate B from the material roll 42 and the winding of the substrate B in the winding shaft 34 are performed in synchronization and the film-forming of the organic layers 12 or the like is performed continuously on the target film-forming material Za while transporting the long target film-forming material Za in the longitudinal direction in the predetermined transport path.

The target film-forming material Za which is fed out from the material roll 42 is nipped and transported by the transport roller pair 36 and initially transported to the coating means 26.

Here, in a case where the target film-forming material Za is a material after the inorganic layer 14 is film-formed, since the protective film F is attached to the surface of the inorganic layer 14, the protective film F is peeled from the target film-forming material Za by synchronizing the transport by the transport roller pair 36 and the above transport and winding using the winding shaft 40 which rotates. That is, in the organic film-forming apparatus 20, the transport roller pair 36 operates as the peeling roller of the protective film F.

The coating means 26 coats the pre-adjusted coating which becomes the organic layer 12 or the pre-adjusted coating which becomes the protective organic layer 16 onto the surface of the target film-forming material Za.

Here, in the manufacturing method of the present invention, the organic layer 12 may be formed by a method (a film-forming method) of forming a film which is formed of a well-known organic compound such as the forming method which is described in JP2009-269193A. Accordingly, as the coating material for forming the organic layer 12, a well-known coating material may be used for forming a film formed of an organic compound by dissolving the organic compound (monomers or oligomers) which forms the organic layer 12 in an organic solvent and further adding an additive such as a silane coupling agent or a photopolymerization initiator as necessary.

In contrast, in the manufacturing method of the present invention, the coating material for forming the protective organic layer 16 is a coating material which contains not only the organic solvent and the organic compound which becomes the protective organic layer 16, but also a surfactant and where the viscosity before coating and before cross-linking is adjusted so as to become a predetermined viscosity. Detailed description in relation to this point will be given below.

In the coating means 26, the coating method of the coating material on the target film-forming material Za is not particularly limited.

Accordingly, for the coating of the coating material, it is possible to use all well-known coating methods of coating such as a die coating method, a dip coating method, an air knife coating method, a curtain coating method, a roller coating method, a wire bar coating method, a gravure coating method, and a slide coating method.

Here, the coating means 26 preferably performs the coating of the coating material using a die coating method (a die coater) since there are cases of coating the coating material on the inorganic layer 14. As described above, the inorganic layer 14 is brittle and tends to split easily; however, with the die coater, only the coating material comes into contact with the inorganic layer 14, whereby it is possible to suitably prevent damage to the inorganic layer 14. In particular, since the protective organic layer 16 which is formed with the manufacturing method of the present invention is extremely thin as described above, the use of a die coater is preferable in a case where such a coating material is coated.

The target film-forming material Za is then transported by the drying means 28. The drying means 28 dries the coating material which is coated by the coating means 26.

The drying method of the coating material is not particularly limited and it is possible to use all well-known drying means as long as it is possible to dry the coating material (remove the organic solvent) so as to enter a cross-linkable state before the target film-forming material Za reaches the light irradiation means 30 according to the heating and drying using a heater, the heating and drying using a hot air, or the like, and the transport speed and the like of the substrate B.

The substrate B is then transported to the light irradiation means 30. The light irradiation means 30 irradiates ultraviolet rays (ultraviolet light), visible light, or the like to the coating material which was coated by the coating means 26 and dried by the drying means 28, cross-links (polymerizes) and cures the organic compound (the monomers and oligomers of the organic compound) which is included in the coating material, and sets the organic layer 12 or the protective organic layer 16.

Here, in the present invention, the cross-linking of the organic compound is not limited to photopolymerization and it is possible to use various types of methods such as thermal polymerization, electron beam polymerization, plasma polymerization, or the like depending on the organic compound which becomes the organic layer. Here, photopolymerization is suitably used in the manufacturing method of the present invention, since, as described above, acrylic based resins such as acrylic resins and methacrylic resins are suitably used as the organic layer 12 and the protective organic layer 16, in particular, as the protective organic layer 16.

The target film-forming material Za which forms the organic layer 12 or the protective organic layer 16 in this manner is nipped and transported by the transport roller pair 38 to reach the winding shaft 34, and is re-wound into a roll shape by the winding shaft 34.

Here, the target film-forming material Za which forms the organic layer 12 is supplied to the inorganic film-forming apparatus 24 (a supply chamber 50 thereof) which is shown in FIG. 2B as a material roll 46 which is wound with the target film-forming material Zb, which corresponds to the inorganic film-forming apparatus 24 which forms the inorganic layer 14.

On the other hand, the target film-forming material Za which forms the protective organic layer 16 is supplied as a functional film roll 48 which is wound with a functional film such as a gas barrier film, and subjected to the following steps and the like.

The inorganic film-forming apparatus 24 film-forms (forms) the inorganic layer 14 by a vapor phase deposition method (vacuum film-forming method) on the surface of the target film-forming material Zb (the organic layer 12) and has a supply chamber 50, a film-forming chamber 52, and a winding chamber 54.

Here, other than the illustrated members, the inorganic film-forming apparatus 24 may have various types of members, which are provided in well-known apparatuses which perform film-forming using the vapor phase deposition method while transporting the long target film-forming material, such as a transport roller pair, a guide member which regulates the position of the target film-forming material Zb in the width direction, various types of sensors, and the like.

The supply chamber 50 has a rotary shaft 56, a guide roller 60, and vacuum evacuation means 61.

In the inorganic film-forming apparatus 24, the material roll 46 where the target film-forming material Zb is wound is mounted on the rotary shaft 56 in the supply chamber 50.

When the material roll 46 is mounted on the rotary shaft 56, the target film-forming material Zb passes through the film-forming chamber 52 from the supply chamber 50 and passes (sheet passing) along a predetermined transport path which reaches a winding shaft 58 in the winding chamber 54. In the inorganic film-forming apparatus 24, the feeding out of the target film-forming material Zb from the material roll 46 and the winding of the target film-forming material Zb after film-forming in the winding shaft 58 are performed in synchronization and the film-forming of the inorganic layers 14 or the like is performed continuously on the target film-forming material Zb in the film-forming chamber 52 while transporting the target film-forming material Zb in the longitudinal direction.

In the supply chamber 50, the target film-forming material Zb is fed out from the material roll 46 by rotating the rotary shaft 56 in the clockwise direction in the diagrams using a driving source which is not shown in the diagrams, guided along a predetermined transport path by the guide roller 60, and fed to the film-forming chamber 52 from a slit 76a which is formed in a partition wall 76.

Here, as a preferable aspect, each of the vacuum evacuation means 61 in the supply chamber 50 and the vacuum evacuation means 82 in the winding chamber 54 is provided in the inorganic film-forming apparatus 24 in the illustrated example. In the inorganic film-forming apparatus 24, the pressure in the supply chamber 50 and the winding chamber 54 during the film-forming is maintained at a predetermined pressure depending on the pressure (film-forming pressure) of the film-forming chamber 52 to be described later using each of the vacuum evacuation means. Due to this, the pressure in adjacent chambers is prevented from influencing the pressure (the film-forming in the film-forming chamber 52) in the film-forming chamber 52.

The vacuum evacuation means 61 is not particularly limited and it is possible to use various types of well-known (vacuum) evacuation means which are used in film-forming apparatuses using a vacuum, such as vacuum pumps such as turbo pumps, mechanical booster pumps, dry pumps, and rotary pumps. The other vacuum evacuation means 74 and 82 to be described later are the same in relation to this point.

The film-forming chamber 52 forms (film-forms) the inorganic layer 14 on the surface (that is, the surface of the organic layer 12) of the target film-forming material Zb using the vacuum deposition method. In the illustrated example, the film-forming chamber 52 has a drum 62, film-forming means 64, a guide roller 68, a guide roller 72, and vacuum evacuation means 74

In addition, a film roll 75 for supplying a protective film F for protecting the film-formed inorganic layer 14 is also arranged in the film-forming chamber 52.

The target film-forming material Zb which is transported to the film-forming chamber 52 is guided along a predetermined transport path by the guide roller 68 and wound at a predetermined position on the drum 62. The target film-forming material Zb is transported in the longitudinal direction while being positioned at a predetermined position by the drum 62 and the inorganic layer 14 is film-formed by the film-forming means 64 using an inorganic film-forming method.

The vacuum evacuation means 74 performs vacuum evacuation of the inside of the film-forming chamber 52 and sets the degree of vacuum depending on the forming of the inorganic layer 14 by the vapor deposition method.

The drum 62 is a cylindrical member which rotates in the counterclockwise direction in the diagram centering on the central axis.

The target film-forming material Zb, which is supplied from the supply chamber 50, guided along the predetermined transport path by the guide roller 68 and wound at a predetermined position on the drum 62, is wound around a predetermined region on the peripheral surface of the drum 62, and transported along the predetermined transport path while being supported and guided by the drum 62, and the inorganic layer 14 is formed on the surface by the film-forming means 64.

The film-forming means 64 film-forms the inorganic layer 14 on the surface of the target film-forming material Zb (the organic layer 12) using the vacuum film-forming method.

In the manufacturing method of the present invention, the inorganic layer 14 may be formed by a well-known vapor phase deposition method (vacuum film-forming method) such as the forming methods which are described in JP2009-269193A. Accordingly, the film-forming methods with the film-forming means 64 are also not particularly limited and it is possible to use all well-known film-forming methods such as CVD, plasma CVD, sputtering, vacuum deposition, and ion plating.

In addition, the film-forming conditions are not particularly limited, and may be appropriately set depending on the film-forming method to be used, the inorganic layer 14 to be formed, the layer thickness of the inorganic layer 14, and the transport speed of the target film-forming material Zb.

Accordingly, the film-forming means 64 is configured by various types of members depending on the vacuum film-forming method to be executed.

For example, when the film-forming chamber 52 performs film-forming of the inorganic layer 14 using an ICP-Chemical Vapor Deposition method (inductively coupled plasma CVD), the film-forming means 64 is configured to have an induction coil for forming an induced magnetic field, gas supply means for supplying a reactive gas to the film-forming region, and the like.

When the film-forming chamber 52 performs film-forming of the inorganic layer 14 using a CCP-Chemical Vapor Deposition method (capacitively coupled plasma CVD), the film-forming means 64 is configured to have shower electrodes or the like with a hollow shape which operate as a high-frequency electrode and reactive gas supply means by having a large number of small holes on the surface which is opposite to the drum 62 and being linked to a supply source of reactive gas.

When the film-forming chamber 52 performs film-forming of the inorganic layer 14 using a vacuum deposition, the film-forming means 64 is configured to have a crucible (evaporation source) which is filled with the film-forming material, a shutter which shields the crucible, and heating means or the like which heats the film-forming material inside the crucible.

Furthermore, when the film-forming chamber 52 performs film-forming of the inorganic layer 14 by sputtering, the film-forming means 64 is configured to have target holding means, high-frequency electrodes, gas supply means, and the like.

Here, in terms of being able to suitably obtain the effects of the present invention to be described later, the plasma CVD and vacuum deposition are suitably used as the forming method of the inorganic layer 14.

The target film-forming material Zb which forms the inorganic layer 14 using the film-forming means 64 while being supported and transported by the drum 62 is guided along a predetermined transport path by the guide roller 72 and transported to the winding chamber 54 from a slit 78a which is formed in the partition wall 78.

Here, as a preferable aspect, the film-forming chamber 52 of the inorganic film-forming apparatus 24 has a film roll 70 which supplies the protective film F (laminated film) for protecting the film-formed inorganic layer 14.

The film roll 70 winds the protective film F into a roll shape. This film roll 70 is rotatably supported by the rotary shaft 70a which is rotated by a driving source which is not shown in the diagram, rotates in synchronization with the transport of the target film-forming material Zb, and feeds out the protective film F. The protective film F is brought in contact with the surface of the inorganic layer 14 by the guide roller 72, and laminated and attached to the target film-forming material Zb. That is, in the film-forming chamber 52, the guide roller 72 also operates as a roller for attaching the protective film F to the target film-forming material Zb.

As described above, since the inorganic layer 14 is thin and brittle, splitting, cracking, peeling and the like are easily generated.

Therefore, by protecting the inorganic layer 14 by attaching the protective film F to the surface thereof after forming the inorganic layer 14, it is possible to prevent damage to the inorganic layer 14 during the winding of the target film-forming material Zb which film-forms the inorganic layer 14, the handling up to the organic film-forming apparatus 20, the transporting in the organic film-forming apparatus 20, and the like. In addition, the handling of the material roll 42 where the target film-forming material Zb which film-forms the inorganic layer 14 is wound is also made easy, that is, it is also possible to improve the workability.

In the manufacturing method of the invention, the protective film F is not particularly limited and it is possible to use well-known plastic films or the like which are used in the protection of the inorganic layer 14 which is formed with the vapor phase deposition method, such as low density polyethylene films (refer to JP2007-138837A and the like).

Here, in the apparatus of the illustrated example, since the lamination and attachment of the protective film F is performed inside the film-forming system for the inorganic layer 14, that is, in a vacuum, the attachment strength (the adhesive force) of the protective film F itself may be extremely weak.

In the illustrated example, the winding chamber 54 has a guide roller 80, the winding shaft 58, and vacuum excavation means 82.

The target film-forming material Zb after film-forming which is transported to the winding chamber 54 is wound into a roll shape by the winding shaft 58 and set as the material roll 42. The target film-forming material Zb is supplied (mounted on the rotary shaft 32) to the organic film-forming apparatus 20 as the material roll 42 which is wound with the target film-forming material Zb which forms the inorganic layer 14.

In the manufacturing apparatus as shown in FIGS. 2A and 2B, when manufacturing the functional film 10a which has three organic and inorganic layers as shown in FIG. 1A, first, the organic layer 12 is formed on the surface of the substrate B by the organic film-forming apparatus 20, next, the inorganic layer 14 is formed on the surface of the organic layer 12 by the inorganic film-forming apparatus 24 and the protective film F is attached thereto, and finally, the protective organic layer 16 is formed on the surface of the inorganic layer 14 by the organic film-forming apparatus 20 after the protective film F is peeled off.

In addition, when manufacturing the functional film 10b which has five organic and inorganic layers as shown in FIG. 1B, first, the organic layer 12 is formed on the surface of the substrate B by the organic film-forming apparatus 20, next, the inorganic layer 14 is formed on the surface of the organic layer 12 by the inorganic film-forming apparatus 24 and the protective film F is attached thereto, next, another organic layer 12 is formed on the surface of the inorganic layer 14 by the organic film-forming apparatus 20 after peeling off the protective film F, next, another inorganic layer 14 is formed on the surface of the organic layer 12 by the inorganic film-forming apparatus 24 and the protective film F is attached thereto, and finally, the protective organic layer 16 is formed on the surface of the inorganic layer 14 by the organic film-forming apparatus 20 after the protective film F is peeled off.

In addition, when manufacturing a functional film which has a number of organic and inorganic layers greater than the above, after repeating the forming of the organic layer 12 and the inorganic layer 14 in the same manner so as to form a predetermined number (the total number of organic and inorganic layers—1) of organic layers 12 and inorganic layers 14, finally, the protective organic layer 16 may be formed on the inorganic layer 14.

As described above, the manufacturing method of the functional film of the present invention manufactures a functional film which alternately has organic layers 12 and inorganic layers 14 on the surface of the substrate B and where the uppermost layer is an organic layer, as in the functional films 10a to 10c as shown in FIGS. 1A, 1B, and 1C.

Here, in the manufacturing method of the present invention, the forming of the organic layers 12 and the inorganic layers 14 may be performed by a well-known method as described above. In addition, the layer thickness is not particularly limited.

In contrast, the protective organic layer 16 which is the uppermost layer of the organic layers contains an organic solvent, an organic compound which becomes the organic layer, and a surfactant where the content when the protective organic layer 16 is formed is 0.01 to 10 mass %, and preferably forms an organic layer with a thickness of 30 to 300 nm using a coating material where the organic solvent is removed and the viscosity (25° C.) prior to cross-linking is 10 CP or more. In the present specification, the viscosity was measured using a B-type viscometer. In a case where there are catalog values as the viscosity of the coating material, it is possible to adopt the catalog values.

By having such a configuration, the present invention has excellent optical characteristics such as the light transmission property and it is possible to stably manufacture a functional film where the entire surface of the inorganic layer 14 is protected by the protective organic layer 16.

As described above, in a functional film where the organic layers 12 and the inorganic layers 14 are alternately laminated on the surface of the substrate (support body) and the uppermost layer is set as the protective organic layer 16 and has a function of protecting the inorganic layer 14, the protective organic layer 16 which is the uppermost layer greatly influences the optical characteristics and it is possible to realize a superior light transmission property as the organic layer becomes thinner. Therefore, in the manufacturing method of the present invention, the protective organic layer 16 which is the organic layer of the uppermost layer is set to a thin film thickness of 300 nm or less.

In addition, as described above, the protective organic layer 16 is formed by a coating method (coating film) which uses a coating material which contains the organic compound which becomes the organic layer.

However, according to research by the present inventors, when the uppermost layer of the organic layers is thinned to 300 nm or less in order to improve the optical characteristics, a phenomenon (this phenomenon is referred to below as "repelling" for convenience) occurs where the coating film which becomes the organic layer at the surface of the inorganic layer is repelled in the manner that a Teflon (registered trademark) sheet or an oil film repels water (the water bounces off and does not stick) and the coating film is partially unformed (left in island shapes).

When such repelling of the coating film occurs, it is not possible to cover the entire surface of the inorganic layer (the inorganic layer which is the layer below the uppermost layer of the organic layers) with the organic layer. As a result, splitting, cracking, peeling, and the like occur in the uppermost inorganic layer, and the intended function of the functional film is no longer exhibited.

As a result of intensive studies, the present inventors found that, concerning the cause of the repelling which occurs when the organic layer which is formed on (the surface of) the inorganic layer is thinned, the repelling occurs due to foreign material which remains on the surface of the inorganic layer which forms the organic layer.

As described above, the inorganic layer is normally formed using a vapor phase deposition method such as plasma CVD or the like. The attachment of foreign material, such as film (particles), which is attached, deposited and peeled off in the film-forming system to the surface of the inorganic layer which is formed by the vapor deposition method is unavoidable. In particular, in a case where the inorganic layer is formed using a method where the directionality of the film-forming is low such as plasma CVD and vacuum deposition, the attachment amount of the foreign material becomes great.

As is well known, the characteristics and properties of the inorganic layers (film of the inorganic compound) and the organic layers (film of the organic compound) are completely different. Therefore, when there is foreign material on the surface of the inorganic layer, repelling of the coating film of the organic layer occurs due to the foreign material.

In addition, as in the manufacturing apparatus shown in FIGS. 2A and 2B, a protective film is attached after forming the inorganic layer, and an organic layer is formed after peeling off the protective film F. In this manner, when the protective film is attached to the surface of the inorganic layer inside the film-forming system, since entrained air is not present in the vacuum and the surface state is active immediately after the film-forming, there is extremely solid attachment to the surface of the inorganic layer even with a protective film F where the adhesion is extremely weak.

Therefore, when the protective film is peeled off in order to form the organic layer or the protective organic layer, attached material and the like which is peeled off from the protective film F remains on the surface of the inorganic layer, and the remaining matter causes the repelling of the coating film of the organic layer to occur in the same manner.

Here, even when the protective film is not attached in the vacuum, the same problems occur in cases where the attachment strength of the adhesive layer of the protective film is strong or cases where the releasing of the adhesive layer is poor.

Such problems do not occur at all in cases where the organic layer is sufficiently thick such that the organic layer on the inorganic layer is 1 μm or more.

However, when a thin organic layer such as 300 nm or less is formed on top of the inorganic layer, the repelling of the coating film which becomes the organic layer occurs and it is not possible to form an appropriate organic layer.

The present inventors also carried out repeated research in order to solve the problem of the repelling of the coating film in the case where the organic layer is thinned. As a result, it was found that in order to prevent the repelling it is important to appropriately set the surface tension of the coating material which becomes the protective organic layer 16, the viscosity of the coating film before cross-linking, and the thickness of the protective organic layer 16. Furthermore, by containing a surfactant where the content when the protective organic layer 16 is formed is 0.01 to 10 mass %, and preferably using a coating material where the organic solvent is removed and the viscosity before cross-linking is 10 cP or more to set the thickness of the protective organic layer 16 to 30 nm or more, it is possible to solve the problem of the repelling when the protective organic layer 16 is thinned and to stably form a uniform protective organic layer 16 which covers the entire surface of the uppermost inorganic layer 14 (the forming surface of the protective organic layer 16).

Accordingly, according to the present invention, it is possible to stably manufacture a functional film which has an excellent light transmission property and which exhibits the intended performance by protecting the inorganic layer 14.

Here, the problem of the repelling may even occur at some positions in the organic layer in a case where the organic layer is thin and the same problems also occur in organic layers 12 other than the protective organic layer 16 when thinned. However, in the functional film according to the manufacturing method of the present invention, the organic layers 12 other than the protective organic layer 16 which is the uppermost layer of the organic layers do not greatly influence the light transmission property of the functional film. Therefore, since it is possible to set the organic layer 12 to have a sufficient thickness where the repelling does not occur, there is no problem.

However, in a case where there is a need to thin the organic layers 12 for some reason and the same repelling occurs even with the organic layers 12, it is possible to solve the problem by forming the organic layers 12 in the same manner as the protective organic layer 16.

In the manufacturing method of the present invention, the coating material which forms the protective organic layer 16 contains, in addition to the organic solvent and the organic compound which becomes the protective organic layer 16, a surfactant where, at the time of forming the protective organic layer 16, the content in the protective organic layer 16 is 0.01 to 10 mass %.

When the content of the surfactant is less than 0.01 mass %, the effect of adding the surfactant is not sufficiently obtained and repelling occurs. In contrast, when the content of the surfactant exceeds 10 mass %, the amount of the surfactant in the protective organic layer 16 is excessively great, and it is no longer possible for the protective organic layer 16 to exhibit a predetermined performance depending on the forming material in terms of the strength of the film and the like. For example, depending on the application of the functional film, in a case where some kind of film-forming is performed by the vapor deposition method on the protective organic layer 16, the resistance of the protective organic layer 16 with respect to the film-forming is insufficient and roughness or the like occurs on the surface.

In consideration of the above, the amount of the surfactant is preferably 0.05 to 5 mass % and particularly preferably 0.1 to 3 mass %.

Here, the surfactant which is used in the coating material which forms the protective organic layer 16 is not particularly limited.

However, according to research by the present inventors, in a case where the uppermost inorganic layer 14 which forms the forming surface of the protective organic layer 16 is a silicon compound, when a silicon compound (surfactant where the silicon compound is the main component) is used as a surfactant, there are cases where the effect of adding the surfactant is not sufficiently obtained and repelling occurs even when the added amount is in the above-described appropriate range.

Therefore, in a case where the uppermost inorganic layer 14 is a silicon compound, it is preferable to use a surfactant which does not include a silicon compound or a surfactant which includes 5 mass % or less of a silicon compound (more preferably 3 mass % or less and even more preferably 2 mass % or less), and it is more preferable to use a fluorine compound (a surfactant where the fluorine compound is the main component) other than the silicon compound.

In other words, in the manufacturing method of the present invention, the coating material forming the inorganic layer 14, which becomes the forming surface of the protective organic layer 16, with a silicon compound (the silicon compound is set as the main component) and forming the protective organic layer 16 preferably contains a surfactant other than the silicon compound. By such a configuration, even when the protective organic layer 16 on the inorganic layer 14 is thinned, it is possible to obtain a preferable result for the effect of the present invention of being able to prevent the repelling of the coating film of the protective organic layer 16 in terms which are able to be specifically expressed.

Incidentally, in the film-forming of the organic layer by coating, there are many cases where a silane coupling agent is added to the coating material with the object of improving the adhesion strength or the like.

Here, according to research by the present inventors, in a case where the uppermost inorganic layer 14 which forms the forming surface of the protective organic layer 16 is a silicon compound, when a silane coupling agent is added to the coating material which forms the protective organic layer 16, the repelling easily occurs. On the other hand, when the silane coupling agent is not used, there are cases where it is not possible to obtain sufficient adhesion in protective organic layer 16.

Here, in other organic layers 12 which have a sufficient thickness, the problems do not occur even when a silane coupling agent is used even in a case where the lower layer is a silicon compound.

Accordingly, in a case where the uppermost inorganic layer 14 which forms the forming surface of the protective organic layer 16 is a silicon compound, whether or not to add the silane coupling agent to the coating material which forms the protective organic layer 16 may be appropriately selected depending on the balance between the adhesion and the repelling. That is, depending on the state or the like of the inorganic layer 14, a silane coupling agent may not be used in a case where the repelling of the coating film occurs extremely easily. In addition, a silane coupling agent may be used in applications where high adhesion is demanded for the protective organic layer 16.

Here, in the present invention, in a case where the uppermost inorganic layer 14 which becomes the forming surface of the protective organic layer 16 is a silicon compound, it is possible to sufficiently suppress the repelling of the coating material even when a silane coupling agent is added to the coating material which forms the protective organic layer 16 by further adjusting the added amount of the surfactant or the layer thickness of the protective organic layer 16.

In the manufacturing method of the present invention, the thickness of the protective organic layer 16 is 30 nm or more.

Here, the thickness of the protective organic layer 16 to be formed is slightly thinner than the film thickness of the coating film in the dried state. That is, in the forming of the protective organic layer 16 in the present invention, the film thickness of the coating film in the dried state is not less than 30 nm.

In addition, in the manufacturing method of the present invention, the coating material which forms the protective organic layer 16 preferably has a viscosity (below 25° C.) of 10 cP or more in a state where the organic solvent which remains in the coating material (in more detail, in the coating film which is formed using the coating material) is 10 mass % or less. In the present specification, the viscosity of the coating material is measured using a B-type viscometer. In a case where there are catalog values as the viscosity of the coating material, it is possible to adopt the catalog values.

As described above, in the manufacturing method of the present invention, after the coating material which becomes the protective organic layer 16 is coated and the coating film is dried, the coating film is cross-linked and cured to form the protective organic layer 16.

Here, depending on the progress of the drying of the coating film, in terms of the film thickness, the repelling gradually becomes more likely to occur; however, on the other hand, in terms of the viscosity of the coating film, the repelling gradually becomes less likely to occur. That is, in order to prevent the repelling of the coating film which becomes the protective organic layer 16, in addition to the decrease in the surface tension due to the adding of the surfactant, the thickness of the coating film in the dried state is important.

Here, according to the research of the present inventors, by containing the surfactant in the coating material which becomes the protective organic layer 16 and setting the thickness of the protective organic layer 16 to 30 nm or more (that is, the thickness of the coating material in the dried state is over 30 nm), it is possible to prevent the repelling of the coating film due to the synergistic effect of the effect of surfactant and the viscosity increase of the coating film even when the repelling becomes more likely due to the drying (film thickness reduction) of the coating material. Here, when the thickness of the protective organic layer 16 is 300 nm or more, as described above, it is not possible to obtain sufficient optical characteristics.

In consideration of the above point, the thickness of the protective organic layer 16 is preferably 50 nm or more, and particularly preferably 80 nm or more.

In addition, in order to more reliably prevent the repelling, it is preferable that the viscosity of the coating film in the dried state be high. According to research by the present inventors, by setting the viscosity of the coating film in the dried state to 10 cP or more, in particular, to 20 cP or more, it is possible to more reliably prevent the repelling.

Here, since the viscosity of the coating film which becomes the protective organic layer 16 in the dried state is greatly influenced by the physical properties of the organic compound which is contained in the coating film (the coating material), it is preferable to appropriately select an organic compound where it is possible to obtain the above-described viscosity in the dried coating film.

In addition, as necessary, the viscosity of the dried coating film may be adjusted by adding a thickening agent to the coating material.

The viscosity (that is, the viscosity during coating) of the coating material which becomes the protective organic layer 16 before coating is not particularly limited; however, in terms of being able to stably manufacture the protective organic layer 16 of 300 nm or less, suitably coating a thin film with a die coater, and the like, 10 cP or less is preferable.

In addition, the coating amount of the coating material is also not particularly limited; however, 3 cc/m$^2$ or more is preferable and setting 3 to 15 cc/m$^2$ is particularly preferable. By setting the coating amount of the coating material to 3 cc/m$^2$ or more, it is possible to ensure favorable coating uniformity even with a thin film. In addition, in a case where the content of the organic compound or the like is small, there is a need to increase the coating amount; however, in such a case, the fluidity of the coating material is increased, and the wetting and spreading increases. That is, with a coating material where the coating amount depending on the film thickness such as 30 to 300 nm is 15 cc/m$^2$, wetting and spreading are appropriately suppressed and it is possible to suitably perform the coating of the coating material.

Furthermore, the surface energy of the uppermost inorganic layer 14 which becomes the forming surface of the protective organic layer 16 is not particularly limited.

However, the higher the surface energy of the uppermost inorganic layer 14, the easier it is to prevent the repelling of the coating film which becomes the protective organic layer 16. During the coating of the protective organic layer 16, the surface energy of the inorganic layer on whose surface the uppermost organic layer is formed is preferably set to 30 mN/N or more, particularly preferably 35 mN/N. In the present specification, the surface energy was measured using an automatic contact angle meter DM-300 manufactured by Kyowa Interface Science Co., Ltd.

In the manufacturing method of the present invention, the coating material which forms the protective organic layer 16 is not particularly limited other than satisfying the above-described necessary conditions.

Accordingly, for the organic compound which becomes the organic layer, a compound according to the organic layer to be formed may be used and also for the organic solvent, an organic solvent may be appropriately selected depending on the organic compound or the like to be used. Here, as the organic compound, as described above, monomers or oligomers of acrylate and methacrylate are suitable.

In addition, as necessary, well-known additives or the like such as photopolymerization initiators or the like may be added to the coating material which forms the protective organic layer 16.

In addition, the content of each of the components may also be appropriately set so as to satisfy the above-described conditions.

Above, description was given of the manufacturing method of the functional film of the present invention; however, the present invention is not limited to the above-described Examples, and various types of improvements and modifications may be adopted without departing from the scope of the present invention as a matter of course.

EXAMPLES

Below, the present invention will be described in more detail by giving specific Examples of the present invention.

Example 1

As shown in FIG. 1A, a gas barrier film was created as a functional film 10a which has three organic and inorganic layers.

As the substrate B, a long PET (polyethylene terephthalate) film with a width of 1000 mm and a thickness of 100 μm was used.

On the other hand, a coating material for film-forming the organic layer 12 was prepared by introducing and mixing 200 g of an acrylate-based monomer (TMPTA, manufactured by Daicel-Cytec Inc.) and 20 g of a photopolymerization initiator (Irg907, manufactured by Nagase & Co., Ltd.) into 1700 g of organic solvent (methyl ethyl ketone).

The material roll 42 which was formed by winding the substrate B was mounted on the rotary shaft 32 of the organic film-forming apparatus 20 shown in FIG. 2A, the surface of the substrate B was coated with the prepared coating marial, dried, and then cross-linked by ultraviolet ray irradiation, and the material roll 46 which was formed by winding the target film-forming material Za which forms the organic layer 12 was obtained.

The coating means 26 controlled the coating amount such that the liquid thickness of the coating material became 10 μm using a die coater. The drying means 28 dried the coating material after coating using drying means with hot air at 100° C. Furthermore, an ultraviolet ray irradiating apparatus was used as light irradiating means 30. The light irradiating means 30 controlled the amount of light such that the irradiation amount of the ultraviolet rays became approximately 500 mJ/cm$^2$ as a cumulative irradiation amount.

The film thickness of the formed organic layer 12 was 1000 nm.

Then, the material roll 46 was mounted on the inorganic film-forming apparatus 24 shown in FIG. 2B, a silicon nitride film with a film thickness of 50 nm was formed using CCP-CVD as the inorganic layer 14 on the surface of the target film-forming material Zb which was film-formed as the organic layer 12, and the material roll 42 which was formed by winding the target film-forming material Zb which formed the inorganic layer 14 was manufactured.

Film-forming means 64 was configured of a shower electrode which was arranged to face the drum 62, a high-frequency power source which supplies plasma excitation power to the shower electrode, a bias power source which supplies a bias power to the drum 62, and supply means which supplies a raw material gas into the shower electrode. Furthermore, the drum 62 was made of stainless steel and was made to operate as a counter electrode of the shower electrode.

As film-forming gasses, silane gas ($SiH_4$), ammonia gas ($NH_3$), nitrogen gas ($N_2$), and hydrogen gas ($H_2$) were used. The supply amounts were set to silane gas 100 sccm, ammonia gas 200 sccm, nitrogen gas 500 sccm, and hydrogen gas 500 sccm. In addition, the film-forming pressure was set to 50 Pa.

Plasma excitation power of 3000 W was supplied from the high-frequency power source to the shower electrode at a frequency of 13.5 MHz. Furthermore, bias power of 500 W was supplied from the bias power source to the drum 62. In addition, during film-forming, the temperature of the drum 62 was adjusted to −20° C.

In addition, the protective film F was laminated and attached to the surface of the film-formed inorganic layer 14 using the film roll 70 and the guide roller 72, and the material roll 42 which was wound the target film-forming material Zb which film-formed the inorganic layer 14 was obtained. As the protective film F, a low density polyethylene sheet which had a polyolefin based adhesive layer was used.

Furthermore, a coating material for film-forming the protective organic layer 16 was prepared by introducing and mixing a fluorine based resin surfactant (FC4432, manufactured by 3M Co. Ltd.), 200 g of an acrylate-based monomer (TMPTA, manufactured by Daicel-Cytec Inc.), and 20 g of a photopolymerization initiator (Irg907, manufactured by Nagase & Co., Ltd.) into 1700 g of organic solvent (methyl ethyl ketone). Here, the amount of the surfactant added to the coating material is adjusted such that the content of the surfactant is 0.01 mass % (Inventive Example 1-1) in the protective organic layer 16 when the protective organic layer 16 is formed.

Next, the material roll 42 was mounted on the organic film-forming apparatus 20 shown in FIG. 2A, the coating material which becomes the protective organic layer 16 was coated and dried on the surface of the inorganic layer 14 and then an acrylate monomer was polymerized by ultraviolet ray irradiation, and a functional (gas barrier) film roll 48 which was formed by winding the target film-forming material Za (gas barrier film) which formed the protective organic layer 16 was obtained.

The coating means 26 controlled the coating amount such that the liquid thickness of the coating material was 4 μm using a die coater. The drying means 28 dried the coating material using drying means with hot air at 100° C. The light irradiating means 30 controlled the light amount such that the amount of irradiation of the ultraviolet rays was approximately 500 J/cm$^2$ as a cumulative irradiation amount. The film thickness of the obtained uppermost organic layer 12 was 100 nm.

Furthermore, seven types of coating material were prepared where the added amounts of the surfactants to be added to the coating material which forms the protective organic layer 16 were changed such that: the content of the surfactant when the protective organic layer 16 was formed was 0 mass % (Comparative Example 1-1); the content of the same surfactant was 0.001 mass % (Comparative Example 1-2); the content of the same surfactant was 0.1 mass % (Inventive Example 1-2); the content of the same surfactant was 1 mass % (Inventive Example 1-3); the content of the same surfactant was 10 mass % (Inventive Example 1-4); the content of the same surfactant was 15 mass % (Comparative Example 1-3); and the content of the same surfactant was 30 mass % (Comparative Example 1-4).

Protective organic layer 16 was formed by using the organic film-forming apparatus 20 shown in FIG. 2A under the same film-forming conditions on the target film-forming material Za which formed the organic layer 12 and the inorganic layer 14 on the substrate B in exactly the same manner using the above coating materials to form gas barrier films.

That is, in the present example, a total of eight gas barrier films were manufactured (Inventive Examples 1-1 to 1-4 and Comparative Examples 1-1 to 1-4).

[Evaluation]

The total light transmission rates [%] of the manufactured gas barrier films were measured using a spectrophotometer.

A case where the total light transmission rate is 85% or more is set as A;

a case where the total light transmission rate is less than 85% and 80% or more is set as B; and a case where the total light transmission rate is less than 80% is set as C.

In addition, the water vapor permeability of the manufactured gas barrier film [g/(m$^2$·day)] was measured using a calcium corrosion method (the method described in JP2005-283561A).

The water vapor permeability was set as follows.

A case of being less than $1.0 \times 10^{-4}$ [g/(m$^2$·day)] is A;

a case of being $1.0 \times 10^{-4}$ [g/(m$^2$·day)] or more and less than $2.0 \times 10^{-4}$ [g/(m$^2$·day)] is B;

a case of being $2.0 \times 10^{-4}$ [g/(m$^2$·day)] or more and less than $1.0 \times 10^{-3}$ [g/(m$^2$·day)] is C; and a case of being $1.0 \times 10^{-3}$ [g/(m$^2$·day)] or more is D.

Here, when the total light transmission rate is evaluated as "B" or higher, and water vapor permeability is evaluated as "C" or higher, the performance is high enough for practical use.

The above results are shown in the following Table 1.

TABLE 1

| | Added Amount | Total Light Transmission Rate | Evaluation | Water Vapor Transmission Rate | Evaluation | Notes |
|---|---|---|---|---|---|---|
| Comparative Example 1-1 | 0 | 78 | C | $1.3 \times 10^{-3}$ | D | Repelling occurred over entire surface |
| Comparative Example 1-2 | 0.001 | 79 | C | $1.7 \times 10^{-3}$ | D | Partial repelling occurred |
| Inventive Example 1-1 | 0.01 | 84 | B | $2.6 \times 10^{-4}$ | C | No repelling |
| Inventive Example 1-2 | 0.1 | 88 | A | $1.7 \times 10^{-4}$ | B | No repelling |
| Inventive Example 1-3 | 1 | 87.5 | A | $1.5 \times 10^{-4}$ | B | No repelling |
| Inventive Example 1-4 | 10 | 87.5 | A | $1.4 \times 10^{-4}$ | B | No repelling |
| Comparative Example 1-3 | 15 | 87 | A | $2.5 \times 10^{-4}$ | C | Strength decrease |
| Comparative Example 1-4 | 30 | 86 | A | $1.3 \times 10^{-3}$ | D | Strength decrease |

As shown in the above Table 1, none of the gas barrier films (Inventive Examples 1-1 to 1-4) according to the present invention where the surfactants which were added to the coating material which forms the protective organic layer 16 were in the appropriate range had visible repelling in the coating film, thereby having an increased protective property in the inorganic layer 14 and a sufficient total light transmission rate and gas barrier property.

On the other hand, in the Comparative Example 1-1 and Comparative Example 1-2 where the added amount of the surfactant was small, repelling occurred in the coating film. As a result, it is considered that it was not possible to sufficiently protect the inorganic layer 14 and the inorganic layer 14 was damaged and the gas barrier property decreased during the winding into a roll shape or other processing. In addition, portions where the protective organic layer 16 was not formed were interspersed in the Comparative Example 1-1 and Comparative Example 1-2 due to the repelling in the coating film. As a result, it is considered that the inorganic layer 14 with a high refractive index is partially exposed to the surface, the interface reflection is amplified and the total light transmission rate is decreased.

In addition, in Comparative Example 1-3 and Comparative Example 1-4 where the added amount of the surfactant is too great, it is considered that the strength of the protective organic layer 16 was low and that the inorganic layer 14 was damaged and the gas barrier property decreased during the winding into a roll shape or other processing.

Example 2

A gas barrier film was manufactured in exactly the same manner as Example 1 other than that the amount of the surfactant was fixed to an amount which is 0.1 mass % in the protective organic layer 16, the types of the organic compounds which were used in the forming of the protective organic layer 16 were changed (five types), and a coating material for film-forming the protective organic layer 16 was prepared.

The organic compounds which were used include octyl diacrylate (inventive Example 2-1, viscosity during drying; 3 cP, manufactured by Daicel-Cytec Inc.); DPGDA (Inventive Example 2-2, viscosity during drying; 10 cP, manufactured by Daicel-Cytec Inc.); TMPTA (Inventive Example 2-3, viscosity during drying; 100 cP, manufactured by Nippon Kayaku Co., Ltd.); bisphenol A diacrylate (Inventive Example 2-4, viscosity during drying; 1400 cP, manufactured by Daicel-Cytec Inc.); and DPHA (Inventive Example 2-5, viscosity during drying; 5250 cP, manufactured by Daicel-Cytec Inc.).

Accordingly, in the present Example, a total of five types of gas barrier film were manufactured for Inventive Example 2-1 to Inventive Example 2-5.

For each of the manufactured gas barrier films, the total light transmission rate [%] and water vapor permeability [g/(m²·day)] were measured in exactly the same manner as Example 1 and, moreover, the evaluation was performed in the same manner.

The results are shown in the following Table 2.

TABLE 2

| | Viscosity | Total Light Transmission Rate | Evaluation | Water Vapor Transmission Rate | Evaluation | Notes |
|---|---|---|---|---|---|---|
| Inventive Example 2-1 | 3 | 83 | B | $3.1 \times 10^{-4}$ | C | Partial repelling |
| Inventive Example 2-2 | 10 | 86 | A | $1.9 \times 10^{-4}$ | B | Slight repelling |
| Inventive Example 2-3 | 100 | 88 | A | $1.7 \times 10^{-4}$ | B | No repelling |
| Inventive Example 2-4 | 1400 | 88 | A | $9.8 \times 10^{-5}$ | A | No repelling |
| Inventive Example 2-5 | 5250 | 88 | A | $9.6 \times 10^{-5}$ | A | No repelling |

As shown in the above Table 2, the higher the viscosity during the drying of the coating film which forms the protective organic layer 16, the more suitably the repelling is able to be prevented, in particular, the repelling in the coating film is suppressed and a favorable gas barrier property is exhibited in cases where the viscosity during the drying is 10 cP or more. Here, even with the Inventive Example 2-1 where the viscosity was low during the drying of the coating film which forms the protective organic layer 16, it was possible to sufficiently suppress the repelling by increasing the amount of the surfactant.

Example 3

Five types of gas barrier films were manufactured in exactly the same manner as Example 2 other than that the amount of the surfactant to be added to the coating material for film-forming the protective organic layer 16 was changed to 0.01 mass % in the protective organic layer 16.

In the present Example, Inventive Example 3-1 corresponds to Inventive Example 2-1 in Example 2; Inventive Example 3-2 corresponds to Inventive Example 2-2 in Example 2; Inventive Example 3-3 corresponds to Inventive Example 2-3 in Example 2; Inventive Example 3-4 corresponds to Inventive Example 2-4 in Example 2; and Inventive Example 3-5 corresponds to Inventive Example 2-5 in Example 2, respectively.

For each of the manufactured gas barrier films, the total light transmission rate [%] and water vapor permeability [g/(m$^2$·day)] were measured in exactly the same manner as Example 1 and, moreover, the evaluation was performed in the same manner.

The results are shown in the following Table 3.

In addition, when Example 2 (surfactant; 0.1 mass %) and Example 3 (surfactant; 0.01 mass %) are compared, the lower the content of the surfactant, the more suitably the drying viscosity in the coating film which becomes the protective organic layer 16 acts on suppressing the repelling. In other words, in a case where the drying viscosity in the coating film which becomes the protective organic layer 16 is low, it is possible to suitably suppress the repelling by increasing the amount of the surfactant.

Example 4

A gas barrier film was manufactured in exactly the same manner as Example 1 other than that the amount of the surfactant was fixed to an amount which is 0.01 mass % in the protective organic layer 16, the added amount of organic compound (TMPTA) for changing the thickness of the protective organic layer 16 was changed (five types) in various ways, and a coating material for film-forming the protective organic layer 16 was prepared.

The thickness of the protective organic layer 16 was set as follows: 10 nm (Comparative Example 4-1); 30 nm (Inventive Example 4-1); 100 nm (Inventive Example 4-2); 300 nm (Inventive Example 4-3); and 500 nm (Comparative Example 4-2).

Accordingly, in the present example, a total of five types of gas barrier film were manufactured for Comparative Example 4-1, Comparative Example 4-2, and Inventive Example 4-1 to Inventive Example 4-3.

TABLE 3

|  | Viscosity | Total Light Transmission Rate | Evaluation | Water Vapor Transmission Rate | Evaluation | Notes |
| --- | --- | --- | --- | --- | --- | --- |
| Inventive Example 3-1 | 3 | 81 | B | $6.1 \times 10^{-4}$ | C | Repelling occurred |
| Inventive Example 3-2 | 10 | 83 | B | $2.9 \times 10^{-4}$ | C | Partial repelling |
| Inventive Example 3-3 | 100 | 84 | B | $2.6 \times 10^{-4}$ | C | No repelling |
| Inventive Example 3-4 | 1400 | 87 | A | $1.4 \times 10^{-5}$ | B | No repelling |
| Inventive Example 3-5 | 5250 | 88 | A | $9.6 \times 10^{-5}$ | A | No repelling |

In the same manner as in Example 2, the higher the coating material viscosity during the drying of the coating film which forms the protective organic layer 16, the more suitably the repelling is able to be prevented. In addition, even with the Inventive Example 1-1 where the viscosity was low during the drying of the coating film which forms the protective organic layer 16, it was possible to sufficiently suppress the repelling by increasing the amount of the surfactant.

For each of the manufactured gas barrier films, the total light transmission rate [%] and water vapor permeability [g/(m$^2$·day)] were measured in exactly the same manner as Example 1 and, moreover, the evaluation was performed in the same manner.

The results are shown in the following Table 4.

TABLE 4

|  | Thickness | Total Light Transmission Rate | Evaluation | Water Vapor Transmission Rate | Evaluation | Notes |
| --- | --- | --- | --- | --- | --- | --- |
| Comparative Example 4-1 | 10 | 82 | B | $4.1 \times 10^{-4}$ | C | Frequent repelling |
| Inventive Example 4-1 | 30 | 84 | B | $2.3 \times 10^{-4}$ | C |  |

TABLE 4-continued

| | Thickness | Total Light Transmission Rate | Evaluation | Water Vapor Transmission Rate | Evaluation | Notes |
|---|---|---|---|---|---|---|
| Inventive Example 4-2 | 100 | 84 | B | $2.6 \times 10^{-4}$ | C | |
| Inventive Example 4-3 | 300 | 81 | B | $1.2 \times 10^{-4}$ | B | Optical characteristic deterioration |
| Comparative Example 4-2 | 500 | 80 | B | $1.2 \times 10^{-4}$ | B | Optical characteristic unacceptable |

As shown in the above Table 4, in Comparative Example 4-1 where the film thickness of the protective organic layer 16 was excessively thin, repelling occurred frequently and it was not possible to obtain a sufficient gas barrier property. In addition, in Comparative Example 4-2 where the film thickness of the protective organic layer 16 was excessively thick, it was not possible to obtain a sufficient optical characteristic. On the other hand, the gas barrier films according to the present invention where the thickness of the protective organic layer 16 was appropriate were excellent in both the transmission rate and the gas barrier property.

Example 5

Four types of gas barrier film were manufactured in exactly the same manner as Example 4 other than that the amount of the surfactant to be added to the coating material for film-forming the protective organic layer 16 was changed to an amount which was 0.1 mass % in the protective organic layer 16.

In the present example, Comparative Example 5-1 corresponds to Comparative Example 4-1 in Example 4; Inventive Example 5-1 corresponds to Inventive Example 4-1 in Example 4; Inventive Example 5-2 corresponds to Inventive Example 4-2 in Example 4; and Inventive Example 5-3 corresponds to Inventive Example 4-3 in Example 4, respectively (there is no example which corresponds to Comparative Example 4-2).

For each of the manufactured gas barrier films, the total light transmission rate [%] and water vapor permeability [g/(m²·day)] were measured in exactly the same manner as Example 1 and, moreover, the evaluation was performed in the same manner.

The results are shown in the following Table 5.

In the same manner as Example 4, as shown in the above Table 4, in Comparative Example 5-1 where the film thickness of the protective organic layer 16 was excessively thin, repelling occurred frequently and it was not possible to obtain a sufficient gas barrier property, whereas the gas barrier films according to the present invention where the thickness of the protective organic layer 16 was appropriate were excellent in both the transmission rate and the gas barrier property.

In addition, when Example 4 (surfactant; 0.01 mass %) and Example 5 (surfactant; 0.1 mass %) are compared, the thinner the thickness of the protective organic layer 16, the more it is possible to obtain a favorable effect of adding the surfactant.

Example 6

A gas barrier film was manufactured in exactly the same manner as Example 1 other than that the amount of the surfactant which was added to the coating material for forming the protective organic layer 16 was fixed to an amount which is 0.1 mass % in the protective organic layer 16, the surface energy of the surface of the inorganic layer 14 which becomes the forming surface of the protective organic layer 16 was adjusted (three types) in various ways, and the coating material for film-forming the protective organic layer 16 was coated.

Here, the adjustment of the surface energy of the inorganic layer 14 was performed by carrying out a corona treatment on the inorganic layer 14 before the coating of the coating material which forms the protective organic layer 16 and adjusting the strength of the corona treatment.

The surface energy of the inorganic layer 14 was set as follows: 40 mN/N (Inventive Example 6-1); 35 mN/N (Inventive Example 6-2); and 30 mN/N (Inventive Example 6-3).

TABLE 5

| | Thickness | Total Light Transmission Rate | Evaluation | Water Vapor Transmission Rate | Evaluation | Notes |
|---|---|---|---|---|---|---|
| Comparative Example 5-1 | 10 | 84 | B | $4.4 \times 10^{-4}$ | C | Frequent repelling |
| Inventive Example 5-1 | 30 | 88 | A | $1.7 \times 10^{-4}$ | B | |
| Inventive Example 5-2 | 100 | 88 | A | $1.5 \times 10^{-4}$ | B | |
| Inventive Example 5-3 | 300 | 82 | B | $1.1 \times 10^{-4}$ | B | Optical characteristic deterioration |

Accordingly, in the present example, a total of three types of gas barrier film were manufactured for Inventive Example 6-1 to Inventive Example 6-3.

For each of the manufactured gas barrier films, the total light transmission rate [%] and water vapor permeability [g/(m²·day)] were measured in exactly the same manner as Example 1 and, moreover, the evaluation was performed in the same manner.

The results are shown in the following Table 6.

TABLE 6

| | | Total Light | | Water Vapor | | |
|---|---|---|---|---|---|---|
| | Surface energy | Transmission Rate | Evaluation | Transmission Rate | Evaluation | Notes |
| Inventive Example 6-1 | 40 | 88 | A | $1.5 \times 10^{-4}$ | B | No repelling |
| Inventive Example 6-2 | 35 | 88 | A | $1.7 \times 10^{-4}$ | B | No repelling |
| Inventive Example 6-3 | 30 | 84 | B | $2.6 \times 10^{-4}$ | C | Slight repelling |

Example 7

Three types of gas barrier film were manufactured in exactly the same manner as Example 6 other than that the amount of the surfactant which was added to the coating material for forming the protective organic layer 16 was changed to 0.01 mass % in the protective organic layer 16.

In the present example, Inventive Example 7-1 corresponds to Inventive Example 6-1 in Example 6; Inventive Example 7-2 corresponds to Inventive Example 6-2 in Example 6; and Inventive Example 7-3 corresponds to Inventive Example 7-3 in Example 6; respectively.

For each of the manufactured gas barrier films, the total light transmission rate [%] and water vapor permeability [g/(m²·day)] were measured in exactly the same manner as Example 1 and, moreover, the evaluation was performed in the same manner.

The results are shown in the following Table 7.

TABLE 7

| | | Total Light | | Water Vapor | | |
|---|---|---|---|---|---|---|
| | Surface energy | Transmission Rate | Evaluation | Transmission Rate | Evaluation | Notes |
| Inventive Example 7-1 | 40 | 84 | B | $2.6 \times 10^{-4}$ | C | Slight repelling |
| Inventive Example 7-2 | 35 | 83 | B | $2.8 \times 10^{-4}$ | C | Slight repelling |
| Inventive Example 7-3 | 30 | 81 | B | $4.8 \times 10^{-4}$ | C | Slight repelling |

As shown in Table 6 and Table 7, in the manufacturing method of the present invention, the higher the surface energy of the inorganic layer 14 which forms the protective organic layer 16, the more favorably the repelling is suppressed and the more it is possible to obtain a high gas barrier property. In addition, the lower the surface energy of the inorganic layer 14 which forms the protective organic layer 16, the more it is possible to obtain a favorable effect of adding the surfactant.

From the above results, the effect of the present invention is obvious.

What is claimed is:

1. A manufacturing method of a functional film comprising:
    forming one or more organic layers and one or more inorganic layers alternately on a substrate;
    forming an organic layer on a surface of one of the inorganic layer as an uppermost layer;
    forming the inorganic layer upon whose surface the uppermost layer is able to be formed;
    attaching a protective film to the surface of the inorganic layer; and
    peeling off the protective film to form the uppermost layer,
    wherein the organic layer as the uppermost layer has a thickness of 30 to 300 nm and is formed by using a coating material containing an organic solvent, an organic compound, and a surfactant, and
    wherein the content of the surfactant in the organic layer as the uppermost layer is 0.01 to 10 mass %.

2. The manufacturing method of a functional film according to claim 1, wherein the forming of the inorganic layer upon whose surface the uppermost layer is able to be formed and the attaching of the protective film to the surface of the inorganic layer are carried out under reduced pressure.

3. The manufacturing method of a functional film according to claim 1, wherein the organic compound is a (meth) acrylate-based organic compound capable of cross-linking by a photopolymerization reaction.

4. The manufacturing method of a functional film according to claim 3,
    wherein the inorganic layer upon whose surface the uppermost layer is formed is formed with a silicon compound, and,
    the surfactant does not include a silicon based surfactant, or includes 5 mass % or less of a silicon based surfactant.

5. The manufacturing method of a functional film according to claim 4, wherein a viscosity of the coating material is 10 cP or more in a state where the organic solvent remaining in the coating material is 10 mass % or less.

6. The manufacturing method of a functional film according to claim 5,
    wherein a surface energy of the inorganic layer upon whose surface the uppermost layer is formed is 30 mN/N or more.

7. The manufacturing method of a functional film according to claim 1, wherein the inorganic layer upon whose surface the uppermost layer is formed is formed with any one of silicon nitride, silicon oxide, silicon oxynitride, and aluminum oxide.

8. The manufacturing method of a functional film according to claim 1,
    wherein the inorganic layer upon whose surface the uppermost layer is formed is formed with a silicon compound, and,
    the surfactant does not include a silicon based surfactant, or includes 5 mass % or less of a silicon based surfactant.

9. The manufacturing method of a functional film according to claim 1, wherein a viscosity of the coating material is 10 cP or more in a state where the organic solvent remaining in the coating material is 10 mass % or less.

10. The manufacturing method of a functional film according to claim 1, wherein the viscosity of the coating material prior to coating of the coating material is 10 cP or less.

11. The manufacturing method of a functional film according to claim 1, wherein the coating material is applied with a die coater.

12. The manufacturing method of a functional film according to claim 1,
   wherein a surface energy of the inorganic layer upon whose surface the uppermost layer is formed is 30 mN/N or more.

13. The manufacturing method of a functional film according to claim 1,
   wherein the inorganic layer upon whose surface the uppermost layer is able to be formed is formed by plasma CVD or vacuum deposition.

* * * * *